United States Patent [19]
Feldberg

[11] 4,077,689
[45] Mar. 7, 1978

[54] CIRCUIT PACKAGE RECEPTACLE WITH INTEGRAL SEPARATION MEANS

[75] Inventor: Leonard H. Feldberg, Spring Valley, N.Y.

[73] Assignee: Burndy Corporation, Norwalk, Conn.

[21] Appl. No.: 790,644

[22] Filed: Apr. 25, 1977

[51] Int. Cl.² .................. H01R 13/54; H05K 1/10
[52] U.S. Cl. ................. 339/75 M; 339/17 CF; 339/176 MP
[58] Field of Search ........... 339/17 CF, 75 R, 75 MP, 339/91 R, 176 MP

[56] References Cited
U.S. PATENT DOCUMENTS

| 3,750,085 | 7/1973 | Cooper | 339/75 M |
| 3,883,207 | 5/1975 | Tomkiewicz | 339/75 M |
| 3,899,234 | 8/1975 | Yeager et al. | 339/75 MP X |
| 3,997,227 | 12/1976 | Cutchaw | 339/17 CF |

Primary Examiner—Roy Lake
Assistant Examiner—E. F. Desmond
Attorney, Agent, or Firm—Howard S. Reiter

[57] ABSTRACT

This invention relates to printed circuit board electrical connector receptacles, and in one embodiment comprises a receptacle for receiving a modular circuit component member of the so-called "dual in-line" type wherein removal of such a component package is facilitated through operation of movable cam means integral with the receptacle, which means is positioned beneath the component member.

16 Claims, 13 Drawing Figures

CIRCUIT PACKAGE RECEPTACLE WITH INTEGRAL SEPARATION MEANS

BACKGROUND OF THE INVENTION

In the field of electrical connectors, particularly those relating to printed circuit boards, frequently it is desired to have a receptacle into which a component package including elements such as an integrated circuit "chip", may be removably inserted. Such packages frequently comprise such elements affixed to a base across which conductive circuitry extends from one or more of the elements to connector prongs oriented substantially parallel to each other and at right angles downward from the bottom of the base of the package. Such component packages may thereby be interconnected with other circuit components on the printed circuit board by thrusting the connector prongs into position between spring loaded receptacle prongs. Typically the voltages and currents involved in such applications are small, so it is desirable and usually necessary for the pressure exerted by the spring-like receptacle prongs on the exterior of the package prongs to be very high in order to ensure that effective electrical interconnection is perfected. Since the connector prongs extending downward from the base of the component package are relatively fragile, they are rendered highly susceptible to bending, breakage and other derogatory effects, particularly when an attempt is made to remove the package from the receptacle against the strong retention forces of the receptacle prongs.

Accordingly, it is an object of this invention to provide an effective receptacle means for dual in-line component packages.

Another object of this invention is to produce such means wherein removal of such packages therefrom will be facilitated.

Still another object of this invention is to produce such means wherein such removal may occur without objectionable derogatory effect to the prongs projecting from the bottom of the package.

Yet another object of this invention is to provide such means in a form and structure which will be mechanically simple and relatively inexpensive to construct and operate.

SUMMARY OF THE INVENTION

Desired objectives may be achieved through practice of the present invention which, in one embodiment, comprises a printed circuit board receptacle for dual in-line packages wherein said receptacle has a base with inclined planes extending from opposite ends upward towards the center of the receptacle, with cooperating wedge-like components juxtaposed to said inclined planes and projecting from said ends of the receptacle, whereby, upon a component package having been positioned in connecting association with said receptacle, such package may be removed by concurrent digital pressure on the outermost ends of both of said wedge members which thereby will press uniformly on the bottom of the component package causing it to be lifted directly upward and out of the receptacle. In an alternative embodiment, a receptacle in accordance with this invention may be made with a single inclined plane and associated wedge member, whereby pressure from a single finger may be utilized to remove and associated circuit package.

DESCRIPTION OF DRAWINGS

This invention may be clearly understood from the description which follows and from the attached drawings in which.

DESCRIPTION OF PREFERRED EMBODIMENTS

Figure 1:
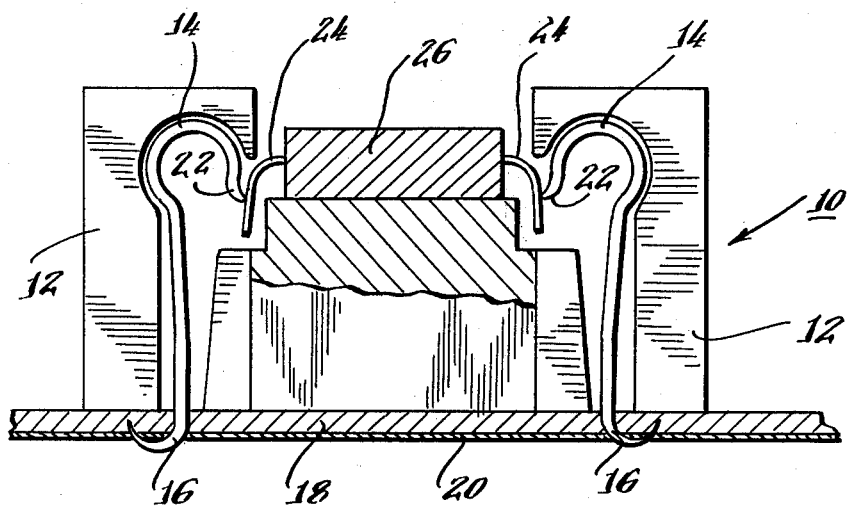
FIG. 1 depicts a printed circuit board receptacle of the type herein contemplated with an associated dual in-line component package in place.

Referring first to FIG. 1, there is depicted a cross-section of a printed circuit board receptacle 10 for so-called "dual in-line" component packages. As illustrated, it comprises sidewalls 12 in which are positioned receptacle contact members 14 which extend downward through holes 16 in an associated printed circuit board 18 for interconnection, as by soldering or other appropriate means, with conductive paths 20 on the printed circuit boards. The contact members 14 present an angled contact point 22 to the surface of the connector prongs 24 of an associated component package 26, in order to insure a reduced area, high unit area pressure, and therefore effective electrical contact therebetween. As will be apparent from FIG. 1 however, such an arrangement, while necessary to ensure good electrical connection between the component parts of the package and the receptacle, tends to make it even more difficult to remove the package from the receptacle since high work forces are necessary to do so and because, as a practical matter, it is virtually impossible to lift the component package 26 straight upward and out of the receptacle 10, thereby tending to cause breakage, bending or other derogatory effects on the fragile contact members 24 of the component package 26.

Figure 2:
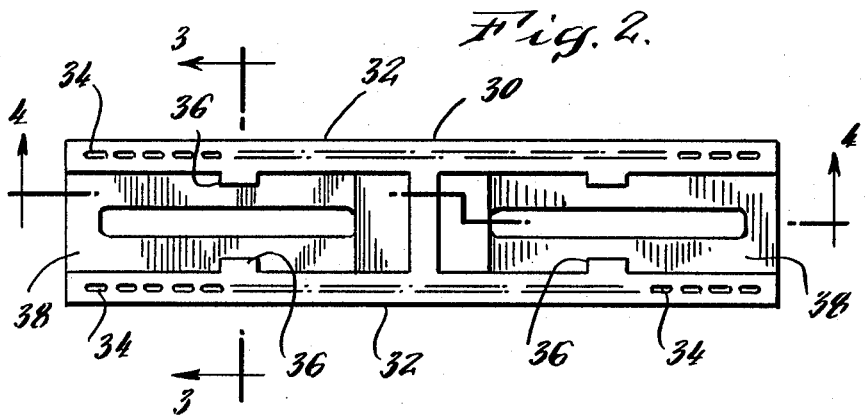
FIG. 2 is a vertical view of one embodiment of this invention.
Figure 3:
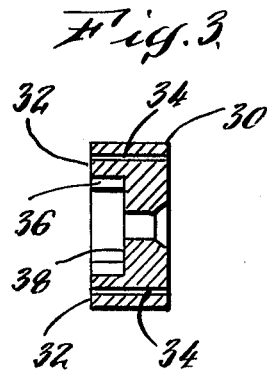
FIG. 3 is a cross-sectional view of the embodiment of this invention shown in FIG. 2 taken along section line 3—3.
Figure 4:
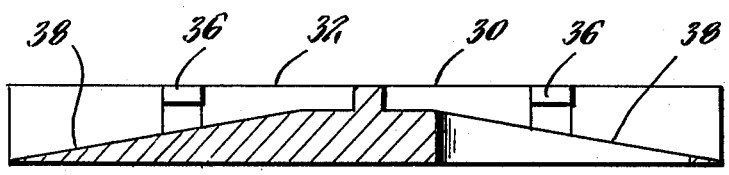
FIG. 4 is a side cross-section of the embodiment of this invention shown in FIG. 2.

Referring to FIGS. 2, 3 and 4 there are depicted three cross-sections of an embodiment of the present invention. FIG. 2, a vertical cross-section, illustrates a receptacle 30 having sidewalls 32 with contact apertures 34 for receiving the contact members of component packages to be associated therewith. In addition, the sidewalls 32 have "ears" 36, the function of which will be described hereinafter. As may be seen from FIGS. 3 and 4 the interior of the receptacle has an inclined planed base 38 formed as an integral part of the receptacle.

Figure 6:
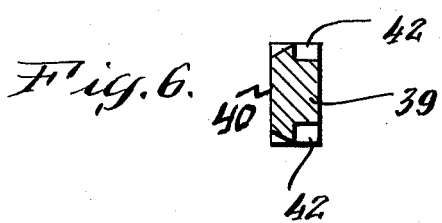
FIG. 6 is a cross-section of the embodiment shown in FIG. 5 taken along the section line 6—6.
Figure 5:
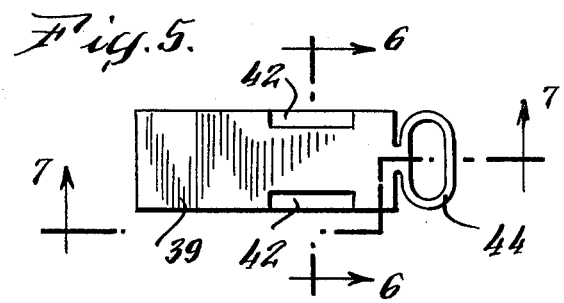
FIG. 5 depicts one embodiment of a wedge member useful in the practice of the present invention.
Figure 7:
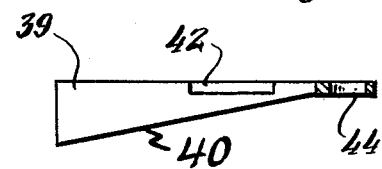
FIG. 7 is a side view cross-section of the embodiment of this invention shown in FIG. 5.

FIGS. 5, 6 and 7 depict wedges or cam members 39 which may be used in connection with the embodiment of this invention illustrated in FIGS. 2, 3 and 4. As shown in FIGS. 5, 6 and 7, these cam members 39 have an inclined plane lower surface 40 corresponding in slope and general configuration to the inclined plane 38 of the receptacle, and also have notches 42 corresponding in depth to, but longer in the long axial direction of the cam members than, the ears 36. It should also be noted that such cam members 39 have a spring-like loop 44 at the innermost end, the function of which is to cause two cam members, when placed in opposing position with respect to each other, to be naturally biased away from each other. Of course, this function might also be served by other structural means, such as a supplemental spring made from metal or other material to supply biasing resilience. Further, it is within the contemplation of this invention that the biasing means may be omitted entirely.

Figure 8:
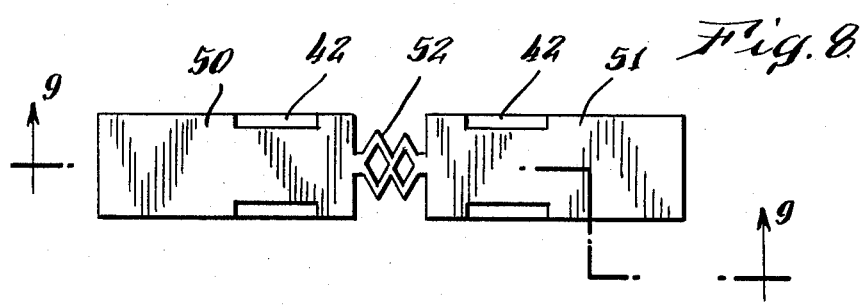
FIG. 8 is a vertical view of a pair of wedge members which embody the present invention.
Figure 9:
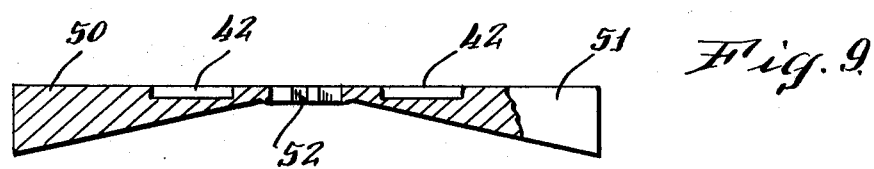
FIG. 9 is a cross-sectional view of the embodiment of this invention shown in FIG. 8.

FIGS. 8 and 9 depict an alternative embodiment of cam structures 51, which, instead of being structurally independent from each other, are joined to each other by means of a "buggy spring" type connection 52 the function of which also is to cause the cam members to be joined to each other, and normally biased away from each other.

Figure 10:
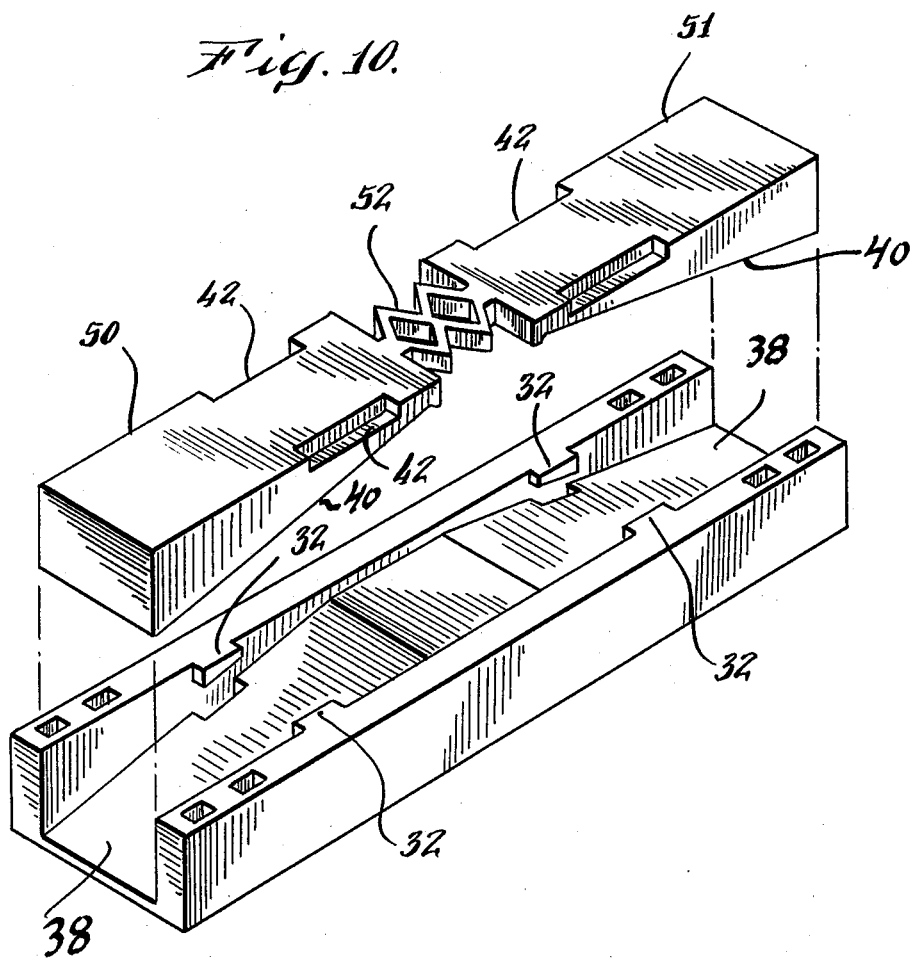
FIG. 10 is a perspective view of the embodiment of this invention shown in FIGS. 8 and 9.

FIG. 10 illustrates, in an exploded perspective view, the manner in which the components of this invention, such as in the embodiment shown in FIGS. 8 and 9, may be fitted together into a cooperative relationship.

Figure 12:
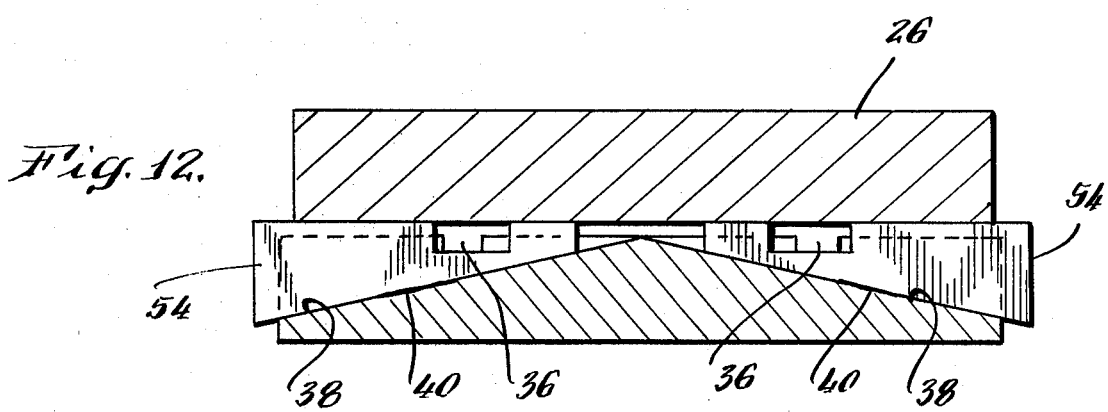
FIG. 12 is a cross-sectional view of the embodiment of this invention shown in FIG. 11 as a second stage of use.
Figure 11:
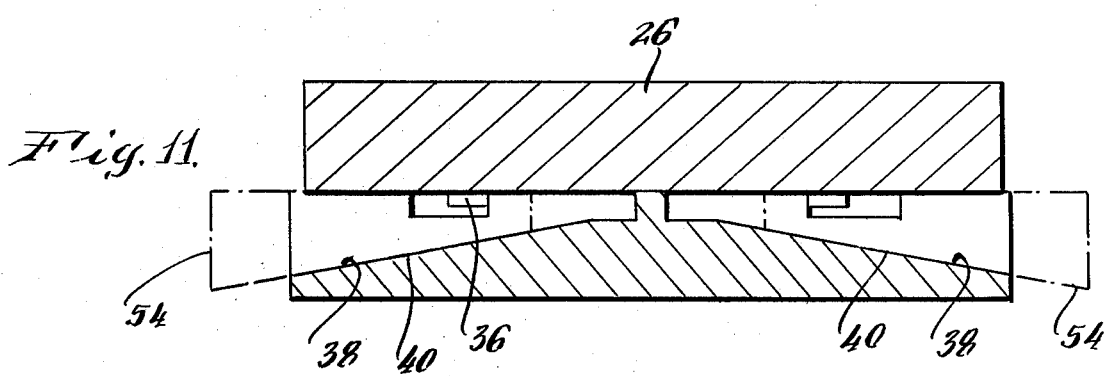
FIG. 11 is a cross-sectional view of an embodiment of the present invention at a first stage of use.

FIG. 11 illustrates in cross-section the operation of the embodiments of this invention heretofore shown and described. As will be apparent from FIG. 11, the cam members 54 have been positioned so that their lower incline plane surfaces 40 are juxtaposed to and in contact with the upper surfaces 38 of the inclined planes which are formed as an integral part of the receptacle housing. In this posture, when a circuit component package 26 is positioned within the receptacle, the cam members 54 project outward from the ends of the receptacle. In this posture when it is desired to remove the package from the receptacle, as is shown in FIG. 12, one needs only to press the cams inward towards each other, as by squeezing the ends of both simultaneously between the thumb and index finger, and this will cause the cams 54 to ride up the inclined planes 38 of the receptacle, thereby removing the circuit component package 26 uniformly and directly upward in a straight motion. As part of this action, the fingers naturally close upon the ends of the circuit component package 26 when it is lifted free of the receptacle and this therefore facilitates removal of the circuit component package without it being dropped or otherwise subjected to damage.

Figure 13:
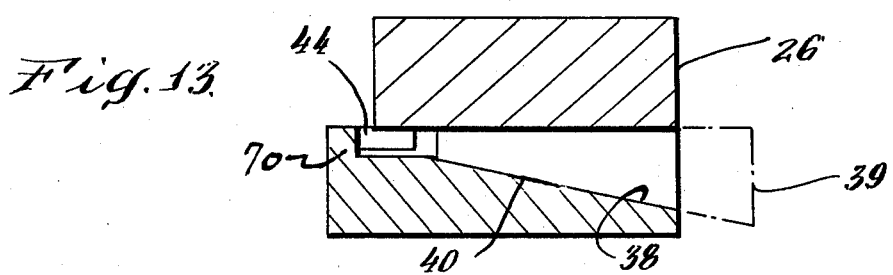
FIG. 13 is a cross-sectional view of another embodiment of this invention.

FIG. 13 illustrates another embodiment of the present invention. As shown, the receptacle portion comprises a single inclined plane 38 to which is juxtaposed a corresponding lower surface 40 of a single cam 39 of the type shown in FIG. 5. In this embodiment provision may be made for the spring portion 44 of the cam 39 to abut an abutment 70 forward as part of the main body of the receptacle. It will be apparent thus with this embodiment, removal of the circuit package 26 is made possible by applying pressure to the cam 39, causing it to slide up the inclined plane 40 and then force the circuit package 26 out of connection with the receptacle.

It will be apparent from the foregoing that the amount of vertical elevation to be imparted to a circuit package will be a function of the length of its connector prong 24, and that this distance will be dependent upon the distance of horizontal travel of the cams and the slope of the angle of the facing incline planes along which the cams are juxtaposed to the receptacle. Thus, it will be clear that the horizontal stroke distance of the cams may be shortened and/or that their elevation potential may be increased by making the slope of the inclined planes steeper. It should also be understood that since it is desirable to have the elevating pressure applied to the component package throughout as much of its length as possible in order to minimize the possibility of the package canting as it comes away from the receptacle, it may be desirable to so construct devices that two or more inclined plane sets in tandem, each having a steeper slope than if only one were used, are in tandem on each cam, corresponding to an equal number of juxtaposed base planes on the receptacle floor.

It should also be understood thus as used in this specification and the accompanying claim, the word "end" (of the receptacle) is not intended to imply any limitation to certain among the constituent side walls of the receptacle. Thus, as to a rectangular receptacle, the present invention might alternatively be oriented with the cams projecting through the longer dimensioned walls instead of through the shorter ones, and that although the former may typically be referred to as "sides" and the latter as "ends", the use of either term here is not intended to express or imply any such limitation or restriction.

Thus, it is to be understood that the embodiments of this invention herein described and illustrated are by way of illustration and not of limitation and that other embodiments will be apparent to those ordinarily skilled in the cognizant arts without departing materially from the spirit or scope of this invention.

I claim:

1. An electrical connector receptacle for effecting electrical interconnection with a circuit component which has a multiplicity of contact members that project a substantially the same direction from said circuit component, comprising at least one peripheral edge, an upper support surface to which said component is to be juxtaposed when said component is in normal use with said contact members electrically interconnected with corresponding members in said receptacle, a base having at least one upward facing inclined plane within said receptacle, which slopes downward in the direction of said receptacle, and a cam member juxtaposed to said inclined plane, and having an upper surface, the uppermost portions of which are configured correspondingly to the uppermost portions of said support surface so as cooperatively therewith to present a unified contact surface to a circuit component positioned thereon, and also having a downward facing inclined plane forming its lower surface substantially corresponding in slope to and shorter in length than the corresponding inclined plane in the base of the receptacle to which it is to be juxtaposed.

2. The device described in claim 1 wherein said cam member is longer than the distance from the innermost end thereof to the peripheral edge of said receptacle when said cam is positioned with its lower surface juxtaposed to said corresponding inclined plane with said uppermost portions of said upper surface positioned at the same height as are the corresponding portions of said support surface.

3. The device described in claim 1 including bias means for causing each of said cam members normally to be impelled toward the peripheral edge of said housing toward which it slopes.

4. The device described in claim 3 wherein said bias means is integral with each of said cam members.

5. The device described in claim 1 comprising two inclined planes, one of each of which slopes downward toward a different one of sidewalls of said receptacle.

6. The device described in claim 2 comprising two inclined planes, one of each of which slopes downward toward a different one of sidewalls of said receptacle.

7. The device described in claim 3 comprising two inclined planes, one of each of which slopes downward toward a different one of said sidewalls of said receptacle.

8. The device described in claim 4 wherein said cam members are integrally connected to each other.

9. The device described in claim 5 wherein said cam members are integrally connected to each other.

10. The device described in claim 6 wherein said cam members are integrally connected to each other.

11. The device described in claim 1 comprising two inclined planes, one of each of which slopes downward toward one of sidewalls of said receptacle.

12. The device described in claim 2 comprising two inclined planes, one of each of which slopes downward toward one of sidewalls of said receptacle.

13. The device described in claim 3 comprising two inclined planes, one of each of which slopes downward toward one of said sidewalls of said receptacle.

14. The device described in claim 10 wherein said cam members are integrally connected to each other.

15. The device described in claim 11 wherein said cam members are integrally connected to each other.

16. The device described in claim 12 wherein said cam members are integrally connected to each other.

* * * * *